US009512970B2

(12) United States Patent
Edwards et al.

(10) Patent No.: US 9,512,970 B2
(45) Date of Patent: Dec. 6, 2016

(54) PHOTOLUMINESCENCE WAVELENGTH CONVERSION COMPONENTS

(71) Applicant: Intematix Corporation, Fremont, CA (US)

(72) Inventors: Charles Edwards, Pleasanton, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 14/213,005

(22) Filed: Mar. 14, 2014

(65) Prior Publication Data

US 2014/0264420 A1 Sep. 18, 2014

Related U.S. Application Data

(60) Provisional application No. 61/801,493, filed on Mar. 15, 2013.

(51) Int. Cl.

| | |
|---|---|
| ***H01J 9/00*** | (2006.01) |
| ***H01J 61/40*** | (2006.01) |
| ***H01J 5/16*** | (2006.01) |
| ***H01L 33/50*** | (2010.01) |
| ***F21V 7/00*** | (2006.01) |
| ***F21V 9/00*** | (2015.01) |
| ***F21V 13/02*** | (2006.01) |
| ***F21K 99/00*** | (2016.01) |
| ***F21V 9/16*** | (2006.01) |

(52) U.S. Cl.
CPC . *F21K 9/56* (2013.01); *F21V 9/16* (2013.01); *F21V 13/02* (2013.01)

(58) Field of Classification Search
USPC ........................................................ 348/835
See application file for complete search history.

(56) References Cited

U.S. PATENT DOCUMENTS

| | | | |
|---|---|---|---|
| 3,290,255 | A | 12/1966 | Smith |
| 3,593,055 | A | 7/1971 | Geusic et al. |
| 3,670,193 | A | 6/1972 | Thorington et al. |
| 3,676,668 | A | 7/1972 | Collins et al. |
| 3,691,482 | A | 9/1972 | Pinnow et al. |
| 3,709,685 | A | 1/1973 | Hercock et al. |
| 3,743,833 | A | 7/1973 | Martie et al. |

(Continued)

FOREIGN PATENT DOCUMENTS

| | | |
|---|---|---|
| CA | 2466979 | 11/2005 |
| CN | 1777999 A | 5/2006 |

(Continued)

OTHER PUBLICATIONS

International Search Report and Written Opinion dated Jul. 10, 2014 in International Application No. PCT/US2014/025314 filed Mar. 13, 2014 (10 pages).

(Continued)

*Primary Examiner* — Ashok Patel
(74) *Attorney, Agent, or Firm* — Vista IP Law Group, LLP

(57) ABSTRACT

A photoluminescence wavelength conversion component comprises a first portion having at least one photoluminescence material; and a second portion comprising light reflective material, wherein the first portion is integrated with the second portion to form the photoluminescence wavelength conversion component.

20 Claims, 9 Drawing Sheets

(56) References Cited

U.S. PATENT DOCUMENTS

| | | | |
|---|---|---|---|
| 3,763,405 A | 10/1973 | Mitsuhata | |
| 3,793,046 A | 2/1974 | Wanmaker et al. | |
| 3,819,973 A | 6/1974 | Hosford | |
| 3,819,974 A | 6/1974 | Stevenson et al. | |
| 3,849,707 A | 11/1974 | Braslau et al. | |
| 3,875,456 A | 4/1975 | Kana et al. | |
| 3,932,881 A | 1/1976 | Mita et al. | |
| 3,937,998 A | 2/1976 | Verstegen et al. | |
| 3,972,717 A | 8/1976 | Wiedemann | |
| 4,047,075 A | 9/1977 | Schoberl | |
| 4,081,764 A | 3/1978 | Christmann et al. | |
| 4,104,076 A | 8/1978 | Pons | |
| 4,143,394 A | 3/1979 | Schoeberl | |
| 4,176,294 A | 11/1979 | Thornton, Jr. | |
| 4,176,299 A | 11/1979 | Thornton | |
| 4,191,943 A | 3/1980 | Cairns et al. | |
| 4,211,955 A | 7/1980 | Ray | |
| 4,305,019 A | 12/1981 | Graff et al. | |
| 4,315,192 A | 2/1982 | Skwirut et al. | |
| 4,443,532 A | 4/1984 | Joy et al. | |
| 4,559,470 A | 12/1985 | Murakami et al. | |
| 4,573,766 A | 3/1986 | Bournay, Jr. et al. | |
| 4,618,555 A | 10/1986 | Suzuki et al. | |
| 4,638,214 A | 1/1987 | Beers et al. | |
| 4,667,036 A | 5/1987 | Iden et al. | |
| 4,678,285 A | 7/1987 | Ohta et al. | |
| 4,727,003 A | 2/1988 | Ohseto et al. | |
| 4,772,885 A | 9/1988 | Uehara et al. | |
| 4,845,223 A | 7/1989 | Seybold et al. | |
| 4,859,539 A | 8/1989 | Tomko et al. | |
| 4,915,478 A | 4/1990 | Lenko et al. | |
| 4,918,497 A | 4/1990 | Edmond | |
| 4,946,621 A | 8/1990 | Fouassier et al. | |
| 4,992,704 A | 2/1991 | Stinson | |
| 5,077,161 A | 12/1991 | Law | |
| 5,110,931 A | 5/1992 | Dietz et al. | |
| 5,126,214 A | 6/1992 | Tokailin et al. | |
| 5,131,916 A | 7/1992 | Eichenauer et al. | |
| 5,143,433 A | 9/1992 | Farrell | |
| 5,143,438 A | 9/1992 | Giddens et al. | |
| 5,166,761 A | 11/1992 | Olson et al. | |
| 5,208,462 A | 5/1993 | O'Connor et al. | |
| 5,210,051 A | 5/1993 | Carter, Jr. | |
| 5,211,467 A | 5/1993 | Seder | |
| 5,237,182 A | 8/1993 | Kitagawa et al. | |
| 5,264,034 A | 11/1993 | Dietz et al. | |
| 5,283,425 A | 2/1994 | Imamura | |
| 5,369,289 A | 11/1994 | Tamaki et al. | |
| 5,371,434 A | 12/1994 | Rawlings | |
| 5,405,709 A | 4/1995 | Littman et al. | |
| 5,439,971 A | 8/1995 | Hyche | |
| 5,518,808 A | 5/1996 | Bruno et al. | |
| 5,535,230 A | 7/1996 | Abe | |
| 5,557,168 A | 9/1996 | Nakajima et al. | |
| 5,563,621 A | 10/1996 | Silsby | |
| 5,578,839 A | 11/1996 | Nakamura et al. | |
| 5,583,349 A | 12/1996 | Norman et al. | |
| 5,585,640 A | 12/1996 | Huston et al. | |
| 5,619,356 A | 4/1997 | Kozo et al. | |
| 5,660,461 A | 8/1997 | Ignatius et al. | |
| 5,677,417 A | 10/1997 | Muellen et al. | |
| 5,679,152 A | 10/1997 | Tischler et al. | |
| 5,763,901 A | 6/1998 | Komoto et al. | |
| 5,770,887 A | 6/1998 | Tadatomo et al. | |
| 5,771,039 A | 6/1998 | Ditzik | |
| 5,777,350 A | 7/1998 | Nakamura et al. | |
| 5,869,199 A | 2/1999 | Kido | |
| 5,947,587 A | 9/1999 | Keuper et al. | |
| 5,959,316 A | 9/1999 | Lowery | |
| 5,962,971 A | 10/1999 | Chen | |
| 5,998,925 A * | 12/1999 | Shimizu et al. | 313/503 |
| 6,137,217 A | 10/2000 | Pappalardo et al. | |
| 6,147,367 A | 11/2000 | Yang et al. | |
| 6,252,254 B1 | 6/2001 | Soules et al. | |
| 6,255,670 B1 | 7/2001 | Srivastava et al. | |
| 6,340,824 B1 | 1/2002 | Komoto et al. | |
| 6,361,186 B1 | 3/2002 | Slayden | |
| 6,504,301 B1 | 1/2003 | Lowery | |
| 6,538,375 B1 | 3/2003 | Duggal et al. | |
| 6,555,958 B1 | 4/2003 | Srivastava et al. | |
| 6,576,488 B2 | 6/2003 | Collins et al. | |
| 6,576,930 B2 | 6/2003 | Reeh et al. | |
| 6,580,097 B1 | 6/2003 | Soules et al. | |
| 6,583,550 B2 | 6/2003 | Iwasa et al. | |
| 6,600,175 B1 | 7/2003 | Baretz et al. | |
| 6,614,170 B2 | 9/2003 | Wang et al. | |
| 6,642,618 B2 | 11/2003 | Yagi et al. | |
| 6,642,652 B2 | 11/2003 | Collins et al. | |
| 6,653,765 B1 | 11/2003 | Levinson et al. | |
| 6,660,332 B2 | 12/2003 | Kawase et al. | |
| 6,680,569 B2 | 1/2004 | Mueller-Mach et al. | |
| 6,709,132 B2 | 3/2004 | Ishibashi | |
| 6,717,353 B1 | 4/2004 | Mueller et al. | |
| 6,812,500 B2 | 11/2004 | Reeh et al. | |
| 6,834,979 B1 | 12/2004 | Cleaver et al. | |
| 6,860,628 B2 | 3/2005 | Robertson et al. | |
| 6,869,812 B1 | 3/2005 | Liu | |
| 6,903,380 B2 | 6/2005 | Barnett et al. | |
| 7,029,935 B2 | 4/2006 | Negley et al. | |
| 7,153,015 B2 | 12/2006 | Brukilacchio | |
| 7,220,022 B2 | 5/2007 | Allen et al. | |
| 7,311,858 B2 | 12/2007 | Wang | |
| 7,390,437 B2 | 6/2008 | Dong | |
| 7,479,662 B2 * | 1/2009 | Soules et al. | 257/98 |
| 7,575,697 B2 | 8/2009 | Li | |
| 7,601,276 B2 | 10/2009 | Li | |
| 7,615,795 B2 | 11/2009 | Baretz et al. | |
| 7,618,157 B1 | 11/2009 | Galvez et al. | |
| 7,655,156 B2 | 2/2010 | Cheng | |
| 7,663,315 B1 | 2/2010 | Hulse | |
| 7,686,478 B1 | 3/2010 | Hulse et al. | |
| 7,943,945 B2 | 5/2011 | Baretz et al. | |
| 7,943,951 B2 | 5/2011 | Kim et al. | |
| 7,972,030 B2 | 7/2011 | Li | |
| 8,274,215 B2 | 9/2012 | Liu | |
| 8,931,933 B2 | 1/2015 | Tong et al. | |
| 2001/0000622 A1 | 5/2001 | Reeh et al. | |
| 2001/0002049 A1 | 5/2001 | Reeh et al. | |
| 2001/0033135 A1 | 10/2001 | Duggal et al. | |
| 2002/0047516 A1 | 4/2002 | Iwasa et al. | |
| 2002/0180351 A1 | 12/2002 | McNulty et al. | |
| 2003/0020101 A1 | 1/2003 | Bogner et al. | |
| 2003/0038596 A1 | 2/2003 | Ho | |
| 2003/0052595 A1 | 3/2003 | Ellens et al. | |
| 2003/0067264 A1 | 4/2003 | Takekuma | |
| 2003/0088001 A1 | 5/2003 | Maekawa | |
| 2003/0102810 A1 | 6/2003 | Cross et al. | |
| 2004/0012959 A1 | 1/2004 | Robertson | |
| 2004/0016908 A1 | 1/2004 | Hohn et al. | |
| 2004/0016938 A1 | 1/2004 | Baretz et al. | |
| 2004/0104391 A1 | 6/2004 | Maeda et al. | |
| 2004/0183081 A1 | 9/2004 | Shishov | |
| 2004/0190304 A1 | 9/2004 | Sugimoto et al. | |
| 2004/0227149 A1 | 11/2004 | Ibbetson et al. | |
| 2004/0227465 A1 | 11/2004 | Menkara et al. | |
| 2004/0239242 A1 | 12/2004 | Mano | |
| 2005/0051782 A1 | 3/2005 | Negley et al. | |
| 2005/0052885 A1 | 3/2005 | Wu | |
| 2005/0057917 A1 | 3/2005 | Yatsuda et al. | |
| 2005/0068776 A1 | 3/2005 | Ge | |
| 2005/0093430 A1 | 5/2005 | Ibbetson et al. | |
| 2005/0110387 A1 | 5/2005 | Landry | |
| 2005/0148717 A1 | 7/2005 | Smith et al. | |
| 2005/0168127 A1 | 8/2005 | Shei et al. | |
| 2005/0207166 A1 | 9/2005 | Kan et al. | |
| 2005/0239227 A1 | 10/2005 | Aanegola et al. | |
| 2005/0242711 A1 | 11/2005 | Bloomfield | |
| 2005/0243550 A1 | 11/2005 | Stekelenburg | |
| 2006/0001352 A1 | 1/2006 | Maruta et al. | |
| 2006/0007690 A1 | 1/2006 | Cheng | |
| 2006/0012299 A1 | 1/2006 | Suehiro et al. | |
| 2006/0023450 A1 | 2/2006 | Chung et al. | |
| 2006/0027786 A1 | 2/2006 | Dong et al. | |
| 2006/0028122 A1 | 2/2006 | Wang et al. | |

(56) References Cited

U.S. PATENT DOCUMENTS

| | | | |
|---|---|---|---|
| 2006/0028837 | A1 | 2/2006 | Mrakovich |
| 2006/0049416 | A1 | 3/2006 | Baretz et al. |
| 2006/0057753 | A1 | 3/2006 | Schardt et al. |
| 2006/0092644 | A1 | 5/2006 | Mok et al. |
| 2006/0097245 | A1 | 5/2006 | Aanegola et al. |
| 2006/0124947 | A1 | 6/2006 | Mueller et al. |
| 2006/0158090 | A1 | 7/2006 | Wang et al. |
| 2006/0244358 | A1 | 11/2006 | Kim et al. |
| 2006/0261309 | A1 | 11/2006 | Li et al. |
| 2006/0262532 | A1 | 11/2006 | Blumel |
| 2007/0029526 | A1 | 2/2007 | Cheng et al. |
| 2007/0091601 | A1 | 4/2007 | Hsieh et al. |
| 2007/0120135 | A1 | 5/2007 | Soules et al. |
| 2007/0170840 | A1 | 7/2007 | Chang-Hae et al. |
| 2007/0240346 | A1 | 10/2007 | Li et al. |
| 2007/0267976 | A1 | 11/2007 | Bohler et al. |
| 2008/0048200 | A1 | 2/2008 | Mueller et al. |
| 2008/0062672 | A1 | 3/2008 | Pang et al. |
| 2008/0111472 | A1 | 5/2008 | Liu |
| 2008/0130285 | A1 | 6/2008 | Negley et al. |
| 2008/0218992 | A1 | 9/2008 | Li |
| 2008/0224597 | A1 | 9/2008 | Baretz et al. |
| 2008/0224598 | A1 | 9/2008 | Baretz et al. |
| 2008/0246044 | A1 | 10/2008 | Pang |
| 2008/0308825 | A1 | 12/2008 | Chakraborty et al. |
| 2009/0026908 | A1 | 1/2009 | Bechtel et al. |
| 2009/0050911 | A1 | 2/2009 | Chakraborty |
| 2009/0086492 | A1 | 4/2009 | Meyer |
| 2009/0103293 | A1 | 4/2009 | Harbers et al. |
| 2009/0219713 | A1 | 9/2009 | Siemiet et al. |
| 2009/0267099 | A1 | 10/2009 | Sakai |
| 2009/0272996 | A1 | 11/2009 | Chakraborty |
| 2009/0283721 | A1 | 11/2009 | Liu |
| 2010/0098126 | A1 | 4/2010 | Singer et al. |
| 2010/0188613 | A1 | 7/2010 | Tsukahara et al. |
| 2010/0295077 | A1 | 11/2010 | Melman |
| 2010/0295442 | A1 | 11/2010 | Harbers et al. |
| 2010/0321921 | A1 | 12/2010 | Ivey |
| 2011/0006316 | A1 | 1/2011 | Ing et al. |
| 2011/0103053 | A1 | 5/2011 | Chen et al. |
| 2011/0147778 | A1 | 6/2011 | Ichikawa |
| 2011/0149548 | A1 | 6/2011 | Yang et al. |
| 2011/0222279 | A1 | 9/2011 | Kim et al. |
| 2011/0227102 | A1 | 9/2011 | Hussell et al. |
| 2011/0228517 | A1 | 9/2011 | Kawabat et al. |
| 2011/0280036 | A1 | 11/2011 | Yi |
| 2011/0292652 | A1 | 12/2011 | Huang et al. |
| 2011/0303940 | A1 | 12/2011 | Lee et al. |
| 2011/0305024 | A1 | 12/2011 | Chang |
| 2011/0310587 | A1 | 12/2011 | Edmond et al. |
| 2012/0051058 | A1 | 3/2012 | Sharma et al. |
| 2012/0086034 | A1 | 4/2012 | Yuan |
| 2012/0106144 | A1 | 5/2012 | Chang |
| 2013/0021792 | A1 | 1/2013 | Snell et al. |
| 2013/0208457 | A1 | 8/2013 | Durkee et al. |
| 2013/0271971 | A1 | 10/2013 | Uemura |
| 2014/0226305 | A1 | 8/2014 | Kim et al. |
| 2015/0098228 | A1 | 4/2015 | Simon et al. |
| 2015/0146407 | A1 | 5/2015 | Boonekamp et al. |
| 2016/0109068 | A1 | 4/2016 | Boonekamp et al. |

FOREIGN PATENT DOCUMENTS

| | | | |
|---|---|---|---|
| CN | 101375420 | A | 2/2009 |
| CN | 101421855 | A | 4/2009 |
| CN | 201621505 | U | 11/2010 |
| CN | 201628127 | U | 11/2010 |
| CN | 101925772 | A | 12/2010 |
| CN | 102159880 | A | 8/2011 |
| CN | 102171844 | A | 8/2011 |
| EP | 647694 | | 4/1995 |
| EP | 2113949 | A2 | 11/2009 |
| GB | 2 017 409 | | 10/1979 |
| GB | 2366610 | | 3/2002 |
| JP | S50-79379 | | 11/1973 |
| JP | 60170194 | | 9/1985 |
| JP | 862-189770 | | 8/1987 |
| JP | H01-1794 71 | | 7/1989 |
| JP | 01-260707 | | 10/1989 |
| JP | H02-91980 | | 3/1990 |
| JP | H3-24692 | | 3/1991 |
| JP | 4010665 | | 1/1992 |
| JP | 4010666 | | 1/1992 |
| JP | 04-289691 | | 10/1992 |
| JP | 4-321280 | | 11/1992 |
| JP | 05-152609 | | 6/1993 |
| JP | 6207170 | | 7/1994 |
| JP | 6-267301 | | 9/1994 |
| JP | 6283755 | | 10/1994 |
| JP | 07-099345 | | 4/1995 |
| JP | 07094785 | | 4/1995 |
| JP | H07-176794 | | 7/1995 |
| JP | 07-235207 | | 9/1995 |
| JP | H7-282609 | | 10/1995 |
| JP | H08-7614 | | 1/1996 |
| JP | 8-250281 | | 9/1996 |
| JP | 2900928 | | 3/1999 |
| JP | H1173922 | | 3/1999 |
| JP | H11251640 | A | 9/1999 |
| JP | 2000031548 | A | 1/2000 |
| JP | 2001177153 | A | 6/2001 |
| JP | 2002133910 | A | 5/2002 |
| JP | 2003101078 | | 4/2003 |
| JP | P2003-234513 | | 8/2003 |
| JP | 2005011953 | | 1/2005 |
| JP | 2005050775 | A | 2/2005 |
| JP | P3724490 | | 9/2005 |
| JP | P3724498 | | 9/2005 |
| JP | 2005330459 | | 12/2005 |
| JP | 2005332951 | A | 12/2005 |
| JP | 2010129300 | A | 6/2010 |
| JP | 2010199145 | A | 9/2010 |
| JP | 2011129661 | A | 6/2011 |
| JP | 2011192793 | A | 9/2011 |
| KR | 10-2007-0065486 | A | 6/2007 |
| KR | 20090017346 | A | 2/2009 |
| KR | 1020120137719 | A | 12/2012 |
| KR | 201330062875 | A | 6/2013 |
| RU | 214492 | | 6/1998 |
| TW | 200527664 | | 8/2005 |
| TW | 200811273 | A | 3/2008 |
| TW | I374926 | | 10/2012 |
| WO | WO 9108508 | | 6/1991 |
| WO | WO 0207228 | | 1/2002 |
| WO | WO 2004021461 | A2 | 3/2004 |
| WO | WO 2004077580 | | 9/2004 |
| WO | WO 2005025831 | | 3/2005 |
| WO | WO 2006022792 | | 3/2006 |
| WO | WO 2007085977 | A1 | 8/2007 |
| WO | WO 2007130357 | A2 | 11/2007 |
| WO | WO 2008019041 | A2 | 2/2008 |
| WO | WO 2008043519 | A1 | 4/2008 |
| WO | WO 2010074963 | A1 | 1/2010 |
| WO | WO 2010038097 | | 4/2010 |
| WO | WO 2010048935 | A1 | 5/2010 |
| WO | WO 2011101764 | A1 | 8/2011 |
| WO | WO 2012047937 | A1 | 4/2012 |

OTHER PUBLICATIONS

"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

(56) References Cited

OTHER PUBLICATIONS

Apr. 14, 2010 Office Action in U.S. Appl. No. 11/264,124.
Apr. 15, 2009 Office Action in U.S. Appl. No. 11/264,124, issued by Abu I Kalam.
Armaroli, N. et al., "Supramolecular Photochemistry and Photophysics.", "J. Am. Chern. Soc.", 1994, pp. 5211-5217, vol. 116.
Aug. 21, 2006 Office Action in U.S. Appl. No. 10/623,198, issued by Thao X. Le.
Aug. 24, 2007 Office Action in U.S. Appl. No. 11/264,124, issued by Thao X. Le.
Aug. 26, 2010 Office Action in U.S. Appl. No. 12/131,118.
Berggren, M. et al., "Light-emitting diodes with variable colours from polymer blends", "Nature", Dec. 1, 1994, pp. 444-446, vol. 372.
Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.
Bradfield, P.L., et al., "Electroluminescence from sulfur impurities in a p-n junction formed in epitaxial silicon", "Appl. Phys. Lett", 07110/1989, pp. 10D-102, vol. 55, No. 2.
Chao, Zhang Jin, et al., "White light emitting glasses", "Journal of Solid State Chemistry", 1991, pp. 17-29, vol. 93.
Comrie, M. , "Full Color LED Added to Lumex's Lineup", "EBN", Jun. 19, 1995, p. 28.
CRC Handbook, 63rd Ed., (1983) p. E-201.
Das, N.C., et al., "Luminescence spectra of ann-channel metal-oxide-semiconductor field-effect transistor at breakdown", 1990, pp. 1152-1153, vol. 56, No. 12.
Dec. 16, 2004 Office Action in U.S. Appl. No. 10/623,198, issued by Thao X. Le.
Dictionary Definition of Phosphor, Oxford English Dictionary Online, Mar. 9, 2012 (Only partial available due to corrupt file as provided on Mar. 22, 2012 in U.S. Appl. No. 12/131,119; Request for Full Reference filed).
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.
Feb. 21, 2012 Office Action in U.S. Appl. No. 12/131,118, issued by Abul Kalam.
Feb. 26, 2008 Office Action in U.S. Appl. No. 11/264,124, issued by Abu I Kalam.
Feb. 4, 2005 Office Action in U.S. Appl. No. 10/623,198, issued by Thao X. Le.
Feb. 7, 2007 Office Action in U.S. Appl. No. 11/264,124, issued by Thao X. Le.
Forrest, S. et al. , "Organic emitters promise a new generation of displays", "Laser Focus World", Feb. 1995, pp. 99-107.
Hamada, Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
Jang, S., "Effect of Avalanche-Induced Light Emission on the Multiplication Factor in Bipolar Junction Transistors", "Solid-State Electronics", 1991, pp. 1191-1196, vol. 34, No. 11.
Jan. 29, 2007 Office Action in U.S. Appl. No. 10/623,198, issued by Thao X. Le.
Jan. 30, 2006 Office Action in U.S. Appl. No. 11/264,124, issued by Thao X. Le.
Jan. 7, 2011 Office Action in U.S. Appl. No. 12/131,119, issued by Steven Y. Horikoshi.
Jul. 10, 2008 Office Action in U.S. Appl. No. 11/264,124, issued by Abu I Kalam.
Jul. 14, 2005 Notice of Allowance, Notice of Allowability, and Examiner's Statement of Reasons for Allowance in U.S. Appl. No. 10/623,198, issued by Thao X. Le.
Jul. 14, 2011 Office Action in U.S. Appl. No. 12/131,119, issued by Steve Horikoshi.
Jul. 7, 2011 Office Action in U.S. Appl. No. 12/131,118, issued by Abu I Kalam.
Jun. 14, 2006 Office Action in U.S. Appl. No. 11/264,124, issued by Thao X. Le.
Jun. 26, 2007 Office Action in U.S. Appl. No. 10/623,198, issued by Thao X. Le.
Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.
Kido, J. et al. , "Bright blue electroluminescence from poly(N-vinylcarbazole)", "Appl. Phys. Letters", Nov. 8, 1993, pp. 2627-2629, vol. 63, No. 19.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AlGaN/GaN Light-Emitting diodes", "Journal of the European Ceramic Society", May 1996, pp. 2033-2037, vol. 17.
Larach, S., et al., "Blue emitting luminescent phosphors: Review and status", "Int'l Workshop on Electroluminescence", 1990, pp. 137-143.
LEDs and Laser Diodes, Electus Distribution, copyright 2001, available at URL:http://www.jaycar.com.au/images_uploaded/ledlaser.Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn:documentum:eCommerce_soi_EU :09007bb280021e27.pdf :09007bb280021e27.pdf.
Mar. 2, 2009 Office Action in U.S. Appl. No. 10/623,198, issued by Abu I Kalam.
Mar. 22, 2012 Office Action in U.S. Appl. No. 12/131,119, issued by Steven Y. Horikoshi.
Mar. 28, 2006 Office Action in U.S. Appl. No. 10/623,198, issued by Thao X. Le.
Mar. 4, 2011 Notice of Allowance, Notice of Allowability, Examiner's Interview Summary, Examiner's Amendment/Comment and Examiner's Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.

(56) References Cited

OTHER PUBLICATIONS

Mimura, Hidenori, et al., "Visible electroluminescence from uc-SiC/porous Si/c-Si p-n junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1AIB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diode", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198, issued by Abu I Kalam.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M. , "Recent trends of development of silicon monocarbide blue-light emission diodes", "Kinzoku", 1989, pp. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics—Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics—Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
Barry, T., Flurrescence of EU2+ Activated Phases in Bunary Alkaline Earth Orthosilicate Systems, Journal of the Electrochemical Society, Nov. 1968, pp. 1181-1184, vol. 115, No. 1.
Non-Final Office Action dated May 8, 2015 for U.S. Appl. No. 13/931,669.
First Office Action for Chinese Patent Application No. 200780032995.8 Issued on Mar. 19, 2010.
Foreign Office Action dated Jun. 13, 2014 for Chinese Appln. No. 200780032995.8.
Foreign Office Action dated Oct. 29, 2012 for Chinese Appln. No. 200780032995.8.
Fourth Office Action dated May 15, 2013 for Chinese Appln. No. 200780032995.8.
Office Action dated Feb. 12, 2014 for Chinese Patent Application No. 200780032995.
Second Office Action for Chinese Patent Application No. 200780032995.8 Issued on Aug. 10, 2011.
Seventh Office Action dated Nov. 3, 2014 for Chinese Appln. No. 200780032995.8.
Third Office Action for Chinese Patent Application No. 200780032995.8 Issued on Dec. 12, 2011.
Foreign Office Action dated Apr. 24, 2012 for Chinese Appln. No. 201010525492.8.
Foreign Office Action dated Mar. 19, 2013 for Chinese Appln. No. 201010525492.8.
Foreign Office Action dated Jul. 5, 2012 for European Appln. No. 07811039.2.
Foreign Office Action dated May 15, 2014 for European Appln. No. 07811039.2.
Foreign Office Action for Japanese Application No. 2009522877 mailed on Apr. 16, 2013.
Foreign Office Action for Japanese Application No. 2009-522877 mailed on Apr. 24, 2012.
Office Action dated Mar. 31, 2015 for JP Patent Appln. No. 2013-154964.
Office Action dated May 20, 2014 for JP Patent Appln. No. 2013-154964.
Foreign Office Action dated Dec. 20, 2013 for Korean Appln. No. 10-2009-7004371.
Notice of Decision of Rejection dated Oct. 29, 2014 for Korean Appln. No. 10-2009-7004371.
Taiwanese Office Action and Search Report for ROC (Taiwan) Patent Applicatoin No. 096128666 mailed on Sep. 1, 2011.
Taiwanese Office Action dated May 11, 2015 for TW Appln. No. 102100038, 6 pages.

(56) References Cited

OTHER PUBLICATIONS

Non-Final Office Action dated Sep. 27, 2012 for U.S. Appl. No. 13/436,471.
Final Office Action Mailed on Jun. 23, 2009 for U.S. Appl. No. 11/640,533.
Final Office Action Mailed on Sep. 23, 2011 for U.S. Appl. No. 11/640,533.
Final Office Action Mailed on Sep. 9, 2010 for U.S. Appl. No. 11/640,533.
Non-Final Office Action Mailed on Jan. 20, 2010 for U.S. Appl. No. 11/640,533.
Non-Final Office Action Mailed on Jul. 25, 2013 for U.S. Appl. No. 11/640,533.
Non-Final Office Action Mailed on Mar. 3, 2011 for U.S. Appl. No. 11/640,533.
Non-Final Office Action Mailed on Oct. 27, 2008 for U.S. Appl. No. 11/640,533.
Notice of Allowance Mailed on Aug. 12, 2011 for U.S. Appl. No. 12/624,839.
Notice of Allowance Mailed on Sep. 26, 2011 for U.S. Appl. No. 12/624,839.
Final Office Action dated Oct. 24, 2014 for U.S. Appl. No. 12/624,900.
Final Office Action dated Feb. 24, 2014 for U.S. Appl. No. 12/624,900.
Final Office Action dated Jan. 11, 2013 for U.S. Appl. No. 12/624,900.
Final Office Action Mailed on Dec. 19, 2011 for U.S. Appl. No. 12/624,900.
Non-Final Office Action dated Sep. 27, 2013 for U.S. Appl. No. 12/624,900.
Non-Final Office Action dated Jun. 27, 2014 for U.S. Appl. No. 12/624,900.
Non-Final Office Action Mailed on Jun. 25, 2012 for U.S. Appl. No. 12/624,900.
Non-Final Office Action Mailed on Mar. 24, 2011 for U.S. Appl. No. 12/624,900.
Final Office Action dated Oct. 30, 2013 for U.S. Appl. No. 13/087,615.
Final Office Action dated Jan. 30, 2013 for U.S. Appl. No. 13/087,615.
Final Office Action dated Jul. 17, 2014 for U.S. Appl. No. 13/087,615.
Non-Final Office Action dated Feb. 11, 2014 for U.S. Appl. No. 13/087,615.
Non-Final Office Action dated May 16, 2013 for U.S. Appl. No. 13/087,615.
Non-Final Office Action dated Sep. 21, 2012 for U.S. Appl. No. 13/087,615.
Final Office Action dated Jun. 12, 2014 for U.S. Appl. No. 13/436,329.
Non-Final Office Action dated Nov. 3, 2014 for U.S. Appln. No.
Non-Final Office Action dated Nov. 12, 2013 for U.S. Appln. No.
Advisory Action dated May 15, 2013 for U.S. Appl. No. 13/436,471.
Final Office Action dated Nov. 4, 2014 for U.S. Appl. No. 13/436,471.
Final Office Action dated Jan. 30, 2014 for U.S. Appl. No. 13/436,471.
Final Office Action dated Mar. 1, 2013 for U.S. Appl. No. 13/436,471.
Non-Final Office Action dated Jul. 18, 2013 for U.S. Appl. No. 13/436,471.
Non-Final Office Action dated May 29, 2014 for U.S. Appl. No. 13/436,471.
Final Office Action dated Jun. 12, 2014 for U.S. Appl. No. 13/436,507.
Non-Final Office Action dated May 22, 2015 for U.S. Appl. No. 13/436,507.
Non-Final Office Action dated Nov. 8, 2013 for U.S. Appl. No. 13/436,507.
Revised Final Office Action dated Nov. 13, 2014 for U.S. Appl. No. 13/436,507.
Final Office Action dated Apr. 5, 2013 for U.S. Appl. No. 13/441,714.
Final Office Action dated Feb. 21, 2014 for U.S. Appl. No. 13/441,714.
Non-Final Office Action dated Jun. 23, 2014 for U.S. Appl. No. 13/441,714.
Non-Final Office Action dated Sep. 19, 2012 for U.S. Appl. No. 13/441,714.
Notice of Allowance dated Jan. 22, 2015.
International Search Report and the Written Opinion dated Aug. 15, 2008 for PCT International Application No. PCT/US2007/017299.
International Preliminary Report on Patentability dated Jan. 8, 2015 for PCT Appln. No. PCT/US13/48354.
International Search Report and Written Opinion dated Sep. 27, 2013 for PCT Appln. No. PCT/US13/48354.
Office Action dated Jul. 8, 2015 for Chinese Appln. No. 201180048303.5.
Office Action dated Sep. 23, 2014 for Chinese Appln. No. 201180048303.5.
Office Action dated Dec. 16, 2014 for Japanese Appln. No. 2013-532890.
Office Action dated Dec. 15, 2014 for Taiwanese Appln. No. 100136131.
Final Office Action dated Mar. 1, 2013 for U.S. Appl. No. 13/253,031.
Non-Final Office Action dated Jun. 13, 2013 for U.S. Appl. No. 13/253,031.
Non-Final Office Action dated Oct. 16, 2012 for U.S. Appl. No. 13/253,031.
Notice of Allowance dated Oct. 2, 2013 for U.S. Appl. No. 13/253,031.
Non-Final Office Action dated Jun. 6, 2014 for U.S. Appl. No. 14/141,275.
Final Office Action dated Feb. 26, 2015 for U.S. Appl. No. 14/108,163.
Non-Final Office Action dated Nov. 10, 2014 for U.S. Appl. No. 14/108,163.
International Preliminary Report on Patentability dated Apr. 9, 2013 for PCT Application No. PCT/US11/54827.
International Search Report and Written Opinion for PCT Application No. PCT/US11/54827.
Foreign Office Action dated Jun. 3, 2015 for CN Appln. No. 201280057372.7.
Extended Search Report dated Sep. 11, 2015 for EP Appln. No. 12839621.5.
Final Office Action dated Mar. 6, 2013 for U.S. Appl. No. 13/273,212.
Non-Final Office Action dated Jun. 17, 2013 for U.S. Appl. No. 13/273,212.
Non-Final Office Action dated Sep. 24, 2012 for U.S. Appl. No. 13/273,212.
Notice of Allowance dated Sep. 24, 2013 for U.S. Appl. No. 13/273,212.
Final Office Action dated Mar. 1, 2013 for U.S. Appl. No. 13/273,215.
Non-Final Office Action dated Jun. 14, 2013 for U.S. Appl. No. 13/273,215.
Non-Final Office Action dated Sep. 24, 2012 for U.S. Appl. No. 13/273,215.
Notice of Allowance dated Sep. 30, 2013 for U.S. Appl. No. 13/273,215.
Final Office Action dated Mar. 1, 2013 for U.S. Appl. No. 13/273,217.
Non-Final Office Action dated Jun. 13, 2013 for U.S. Appl. No. 13/273,217.
Non-Final Office Action dated Sep. 24, 2012 for U.S. Appl. No. 13/273,217.
Notice of Allowance dated Sep. 24, 2013 for U.S. Appl. No. 13/273,217.

(56) References Cited

OTHER PUBLICATIONS

Non-Final Office Action dated Jun. 19, 2014 for U.S. Appl. No. 14/101,247.
International Preliminary Report on Patentability dated Apr. 24, 2014 for PCT Appln. No. PCT/US2012/059892.
International Search Report and Written Opinion dated Mar. 28, 2013 for PCT/US2012/0598292.
Park J.K., et al., Optical Properties of Eu2+ Activated Sr2Sio4 Phosphor for Light-Emitting Diodes, Electrochemical and Solid-State Letters, Feb. 25, 2004, pp. H15-H17, vol. 7, No. 5.
PCT International Search Report and Written Opinion dated Apr. 7, 2014, Appln No. PCT/US2013/077462, Forms (PCT/ISA/220, PCT/ISA/210, and PCT/ISA/237).
PCT International Search Report dated Apr. 7, 2014 in International Application No. PCT/US2013/07762 filed Dec. 23, 2013, Form ISA 220 and 210.
PCT Written Opinion dated Apr. 7, 2014 in International Application No. PCT/US2013/07762 filed Dec. 23, 2013, Form ISA 237.
Supplementary European Search Report for EP 07811039.2, Apr. 15, 2011, 15 pages.
Yoo, J.S., et al., Control of Spectral Properties of Strontium-Alkaline Earth-Silicate-Europiem Phosphors for LED Applications, Journal of the Electrochemical Society, Apr. 1, 2005 pp. G382-G385, vol. 152, No. 5.
Non-Final Office Action dated Dec. 3, 2015 for U.S. Appl. No. 14/213,096.
Foreign Office Action dated Dec. 10, 2015 for Chinese Appln. No. 201180048303.5.
Foreign Office Action dated Sep. 23, 2014 for Chinese Appln. No. 201180048303.5.
First Office Action for Chinese Patent Application No. 201380032879.1 issued on Jan. 27, 2016.
Final Office Action dated Feb. 16, 2016 for U.S. Appl. No. 13/931,669.
Non-Final Office Action dated Jan. 20, 2016 for U.S. Appl. No. 14/157,501.
Non-Final Office Action dated Jan. 22, 2016 for U.S. Appl. No. 14/624,493.
Final Office Action dated Jan. 21, 2016 for U.S. Appl. No. 14/136,972.
Non-Final Office Action dated Apr. 21, 2015 for U.S. Appl. No. 14/136,972.
Foreign Office Action dated Feb. 1, 2016 for CN Appln. No. 201280057372.7.
Non-Final Office Action dated May 8, 2015 for U.S. Appl. No. 14/607,032.
Non-Final Office Action dated Mar. 3, 2016 for U.S. Appl. No. 14/607,032.
Final Office Action dated Jul. 1, 2016 for U.S. Appl. No. 14/157,501.
Non-Final Office Action dated Feb. 16, 2016 for U.S. Appl. No. 13/931,669.
Non-Final Office Action dated Jul. 22, 2016 for U.S. Appl. No. 14/136,972.
Foreign Office Action dated Jun. 28, 2016 for Japanese Appln. No. 2014-535097.
Non-Final Office Action dated Aug. 12, 2016 for U.S. Appl. No. 14/641,237.

* cited by examiner

PHOTOLUMINESCENCE WAVELENGTH CONVERSION COMPONENTS

RELATED APPLICATIONS

The present application claims the benefit of priority to U.S. Provisional Application No. 61/801,493, filed on Mar. 15, 2013, which is hereby incorporated by reference in its entirety.

FIELD

This disclosure relates to photoluminescence wavelength conversion components for use with solid-state light emitting devices to generate a desired color of light.

BACKGROUND

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more one or more photoluminescent materials (e.g., phosphor materials), which absorb a portion of the radiation emitted by the LED and re-emit light of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color. Alternatively, the LED chip or die may generate ultraviolet (UV) light, in which phosphor(s) to absorb the UV light to re-emit a combination of different colors of photoluminescent light that appear white to the human eye.

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically the phosphor material is mixed with light transmissive materials, such as silicone or epoxy material, and the mixture applied to the light emitting surface of the LED die. It is also known to provide the phosphor material as a layer on, or incorporate the phosphor material within, an optical component, a phosphor wavelength conversion component, that is located remotely to the LED die ("remote phosphor" LED devices).

FIG. 1 shows one possible approach that can be taken to implement a lighting device 100 when using a wavelength conversion component 102. The wavelength conversion component 102 includes a photoluminescence layer 106 having phosphor materials that are deposited onto an optically transparent substrate layer 104. The phosphor materials within the photoluminescence layer 106 generate photoluminescence light in response to excitation light emitted by an LED die 110. The LED die 110 is attached to a MCPCB 160. The wavelength conversion component 102 and the MCPCB 160 are both mounted onto a thermally conductive base 112.

The wavelength conversion component 102 is manufactured to include a protruding portion 108 along the bottom. During assembly of the lighting device 100, the protruding portion 108 acts as an attachment point that fits within a recess formed by mounting portion 116 of the thermally conductive base 112.

To increase the light emission efficiency of the lighting device 100, a reflective material 114 is placed onto the thermally conductive base 112. Since the light emitted by the phosphor materials in the photoluminescence layer 106 is isotropic, this means that much of the emitted light from this component is projected in a downwards direction. As a result, the reflective material 114 is necessary to make sure that the light emitted in the downwards direction is not wasted, but is instead reflected to be emitted outwardly to contribute the overall light output of the lighting device 100.

One problem with this approach is that adding the reflective material 114 to the base 112 requires an additional assembly step during manufacture of the lighting device. Moreover, significant material costs are required to purchase the reflective material 114 for the light assembly. In addition, it is possible that the reflective surface of the reflective material 114 may end up damaged during shipping or assembly, thereby reducing the reflective efficiencies of the material. An organization may also incur additional administrative costs to identify and source the reflective materials.

Another problem with this type of configuration is that light emitted from the lower levels of the photoluminescence layer 106 can be blocked by the mounting portion 116 on the base 112. This effectively reduces the lighting efficiency of the lighting device 100. Since phosphor materials are a relatively expensive proportion of the cost of the lighting device, this wastage of the light from the lower portions of the wavelength conversion component 102 means that an excessive amount of costs was required to manufacture the phosphor portion of the product without receiving corresponding amounts of lighting benefits.

SUMMARY OF THE INVENTION

Embodiments of the invention concern an integrated lighting component that includes both a wavelength conversion portion and a reflector portion and may optionally further include a third optical portion which can include a light diffusive material.

According to one embodiment a photoluminescence wavelength conversion component comprises: a first portion having at least one photoluminescence material; and a second portion comprising light reflective material, wherein the first portion is integrated with the second portion to form the photoluminescence wavelength conversion component. In some embodiments the component further comprises a third optical portion. The third optical portion can comprise a lens. Alternatively, and or in addition, the third optical portion can comprise a light diffusive material. In preferred embodiments the light diffusive material comprises nanoparticles.

Preferably the first portion, second portion and or third portions have matching indices of refraction and each can be manufactured from the same base material.

The component having the first portion, the second portion and/or third portion can be co-extruded. For example, where the component has a constant cross section the first portion, the second portion and/or third portion can be co-extruded.

In some embodiments the at least one photoluminescence material is incorporated in and homogeneously distributed throughout the volume of the first portion.

The second portion can comprise an angled slope. To reduce light loss the angled slope extends from a base of the first portion to a top of an attachment portion of the component.

According to another embodiment, a method of manufacturing a lamp, comprises: receiving an integrated photoluminescence wavelength conversion component, wherein the photoluminescence wavelength conversion component comprises a first portion having at least one photoluminescence material and a second portion comprising light reflective material, wherein the first portion is integrated with the second portion to form the photoluminescence lighting component; and assembling the lamp by attaching the integrated photoluminescence wavelength conversion component to a base component, such that the integrated photoluminescence wavelength conversion component is attached to the base portion without separately attaching the first portion and the second portion to the base portion.

According to an embodiment of the invention a method of manufacturing a photoluminescence wavelength conversion component, comprises: extruding a first portion having at least one photoluminescence material; and co-extruding a second portion comprising light reflective material, wherein the first portion is integrated with the second portion to form the photoluminescence wavelength conversion component. Advantageously the method further comprises co-extruding a third optical portion.

BRIEF DESCRIPTION OF THE DRAWINGS

In order that the present invention is better understood LED-based light emitting devices and photoluminescence wavelength conversion components in accordance with the invention will now be described, by way of example only, with reference to the accompanying drawings in which like reference numerals are used to denote like parts, and in which.

DETAILED DESCRIPTION OF THE INVENTION

Figure 2:
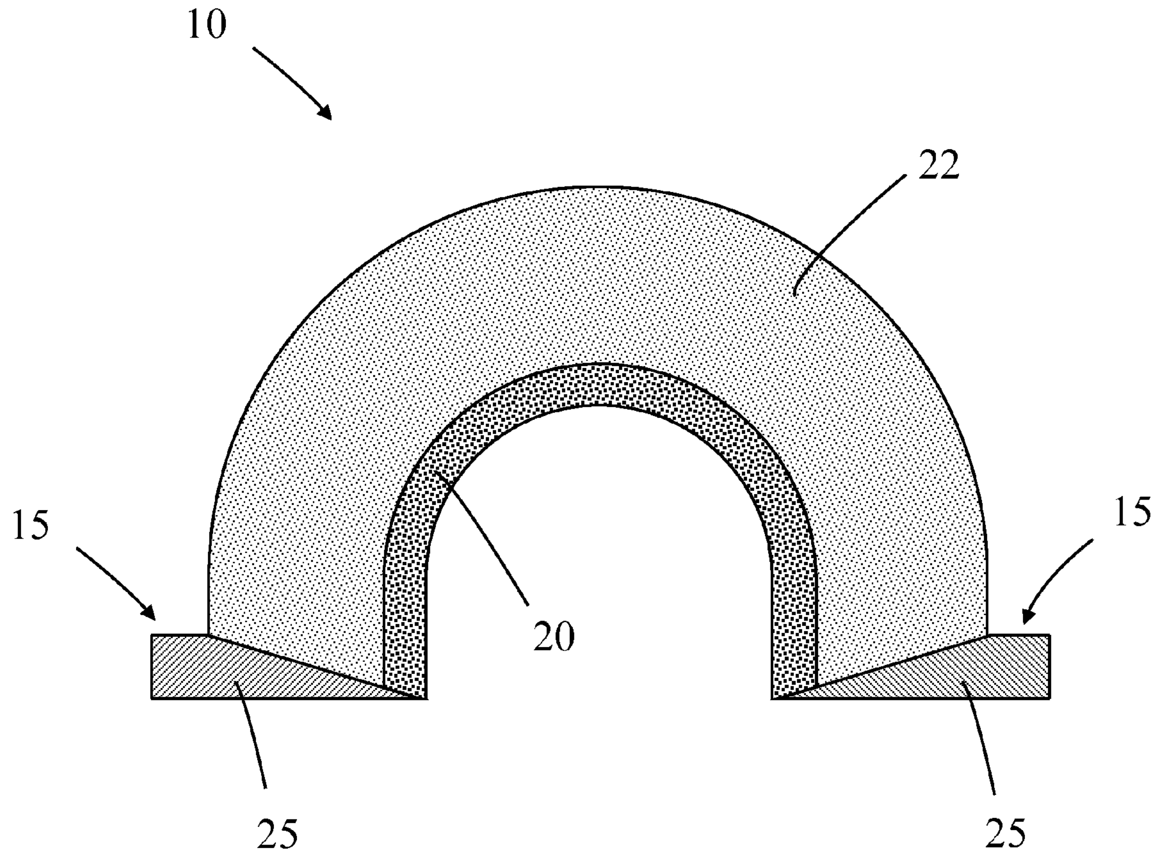
FIG. 2 is a schematic end view of an integrated photoluminescence wavelength conversion component in accordance with an embodiment of the invention.

Some embodiments of the invention are directed to an integrated lighting component that includes both a wavelength conversion portion and a reflector portion. FIG. 2 illustrates an end view of an integrated component 10 that includes both a wavelength conversion layer 20, a an optical component portion 22 and a reflector portion 25. The optical component portion 22 can be implemented as an optically transparent substrate or lens upon which the materials of the wavelength conversion layer 20 have been deposited. The integrated component 10 also includes feet/extended portions 15. These extended portions 15 are to assemble component 10 to a base, by inserting the extended portions 15 within a matching recess on the base portion.

By integrating both the wavelength conversion portion 20 and the reflector portion 25 into a unitary component, this avoids many of the problems associated with having them as separate components. Recall that the alternative approach of having separate components requires a step to assemble the reflective component onto a base, followed by an entirely separate step to then place the wavelength conversion component onto the exact same base. With the present invention, the integrated component can be assembled to the base without requiring separate actions for the reflective component and the wavelength conversion component. Instead, both are assembled to the base in the present approach by assembly the single integrated component 10 to the base.

In addition, significant material cost savings can be achieved with the present invention. The overall cost of the integrated component is generally less expensive to manufacture as compared to the combined costs of having a separate wavelength conversion component and a separate reflector component. A separate reflector component (such as a light reflective tape) typically includes, for example, a substrate for the reflective materials (e.g., paper materials) and an adhesive portion on the underside to form the adhesive tape properties, with these costs passed on to the purchaser of the reflector product. In addition, separate packaging costs would also exist for the separate reflector component, which would likewise be passed onto the purchaser of the product. Moreover, an organization may incur additional administrative costs to identify and source the separate reflective component. By providing an integrated component that integrates the reflector portion with the wavelength conversion portion, many of these additional costs can be avoided.

Furthermore, it can be seen that the reflective surface of the reflector portion 25 is within the interior of the component 10. This makes it less likely that the reflective properties of the reflector portion 25 could be accidentally damaged, e.g., during assembly or shipping. In contrast, a separate reflector component has its reflective portion exposed, creating a greater risk that the reflective surface may end up damaged during shipping or assembly. Any damage to the reflective surface could reduce the reflective efficiencies of the material, which may consequently reduce the overall lighting efficiency of the lighting device that uses the separate reflector component.

Figure 1:
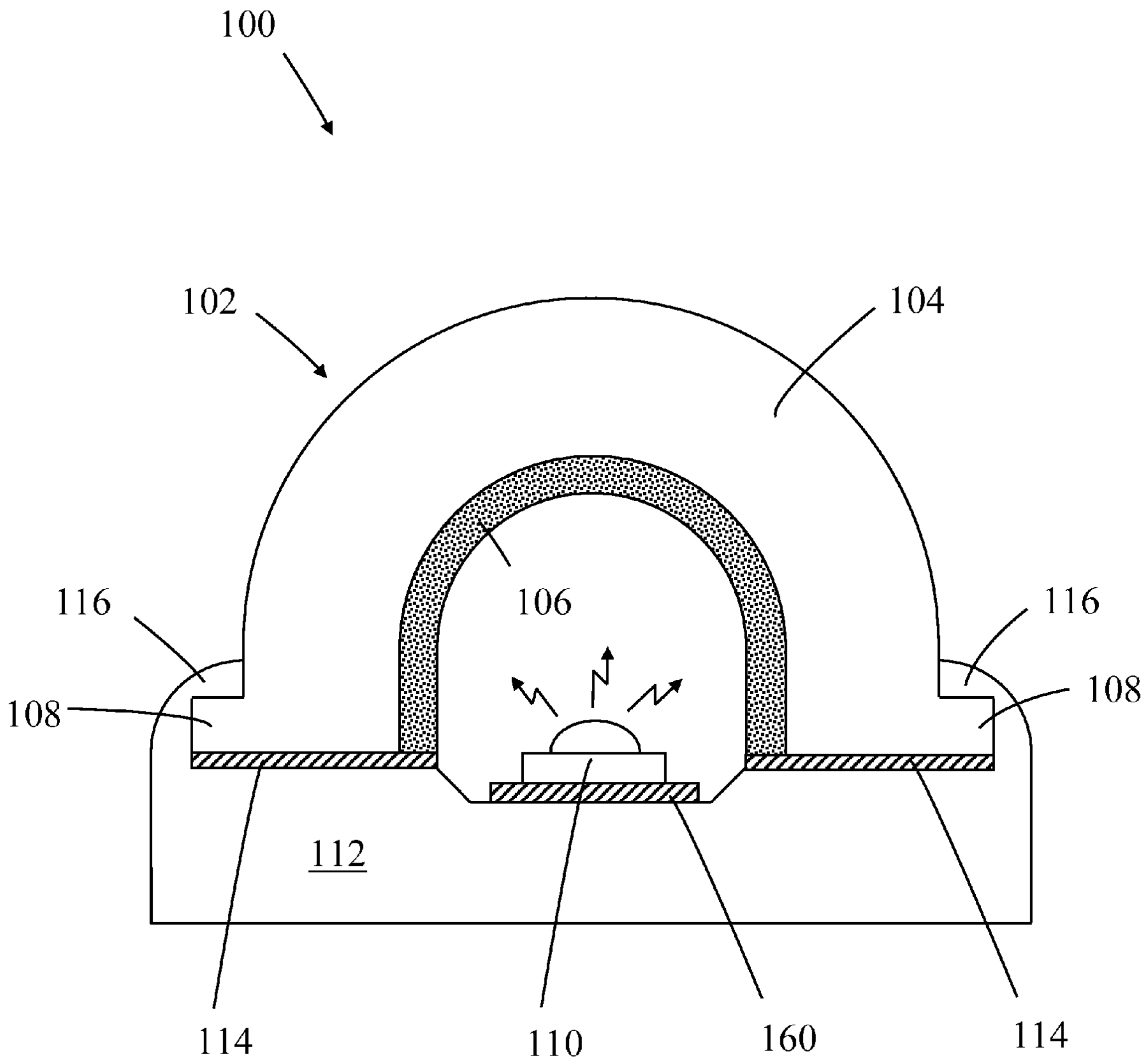
FIG. 1 shows an end view of a linear lamp as previously described.

The present invention also provides better light conversion efficiencies for the phosphor materials of the wavelength conversion layer 20. As previously discussed, one problem with the configuration of FIG. 1 that has feet/extended portions 108 is that light emitted from the lower levels of the wavelength conversion layer can be blocked by the mounting portion 116 on base 112. This effectively reduces the lighting efficiency of the lighting device 100. Since phosphor materials are a relatively expensive proportion of the cost of the lighting device, this wastage of the light from the lower portions of the wavelength conversion component 102 means that an excessive amount of costs was required to manufacture the phosphor portion of the product without receiving corresponding amounts of lighting benefits.

In the present invention, the integrated nature of the component 10 allows the reflector portion 25 to assume any appropriate configuration relative to the rest of the component 10. As shown in FIG. 2, this embodiment has the reflector portion 25 configured such that it slopes upward from the bottom of the wavelength conversion layer 20 up towards the upper height of the feet 15. This angled implementation of the reflector portion 25 means that light produced by the bottom portion of the wavelength conversion layer 20 will tend to reflect outwards from the bottom of the light, rather than towards the sides of the light. Therefore, less of the phosphor-generated light will be blocked by the mounting portion 116 or within the recess created by mounting portion 116. As a result, greater lighting emission efficiencies can be achieved, which means that less phosphor materials are required to otherwise achieve the same relative light output as the prior art lighting products.

Lighting products and lamps that employ the present invention can be configured to have any suitable shape or form. In general, lamps (light bulbs) are available in a number of forms, and are often standardly referenced by a combination of letters and numbers. The letter designation of a lamp typically refers to the particular shape of type of that lamp, such as General Service (A, mushroom), High Wattage General Service (PS—pear shaped), Decorative (B—candle, CA—twisted candle, BA—bent-tip candle, F—flame, P—fancy round, G—globe), Reflector (R), Parabolic aluminized reflector (PAR) and Multifaceted reflector (MR). The number designation refers to the size of a lamp, often by indicating the diameter of a lamp in units of eighths of an inch. Thus, an A-19 type lamp refers to a general service lamp (bulb) whose shape is referred to by the letter "A" and has a maximum diameter two and three eights of an inch. As of the time of filing of this patent document, the most commonly used household "light bulb" is the lamp having the A-19 envelope, which in the United States is commonly sold with an E26 screw base.

Figure 3:
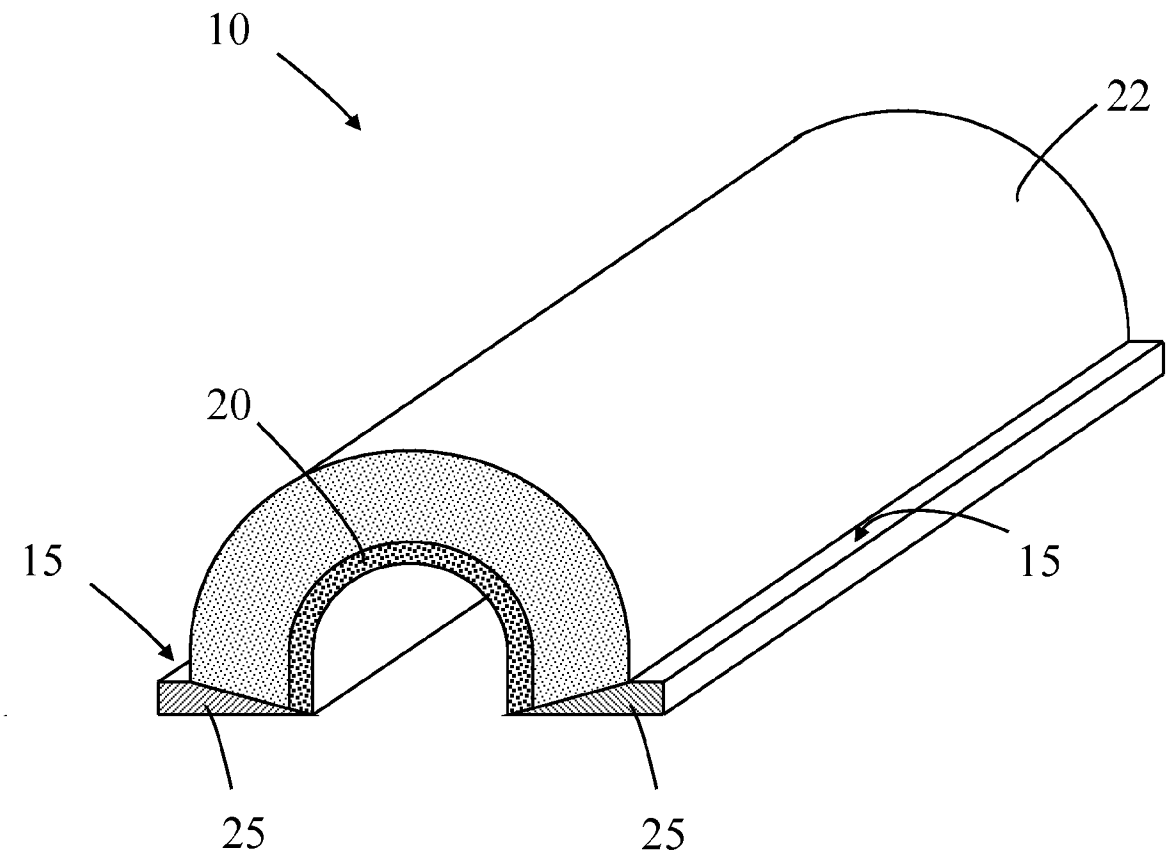
FIG. 3 is a perspective view of the component of FIG. 2.
Figure 4:
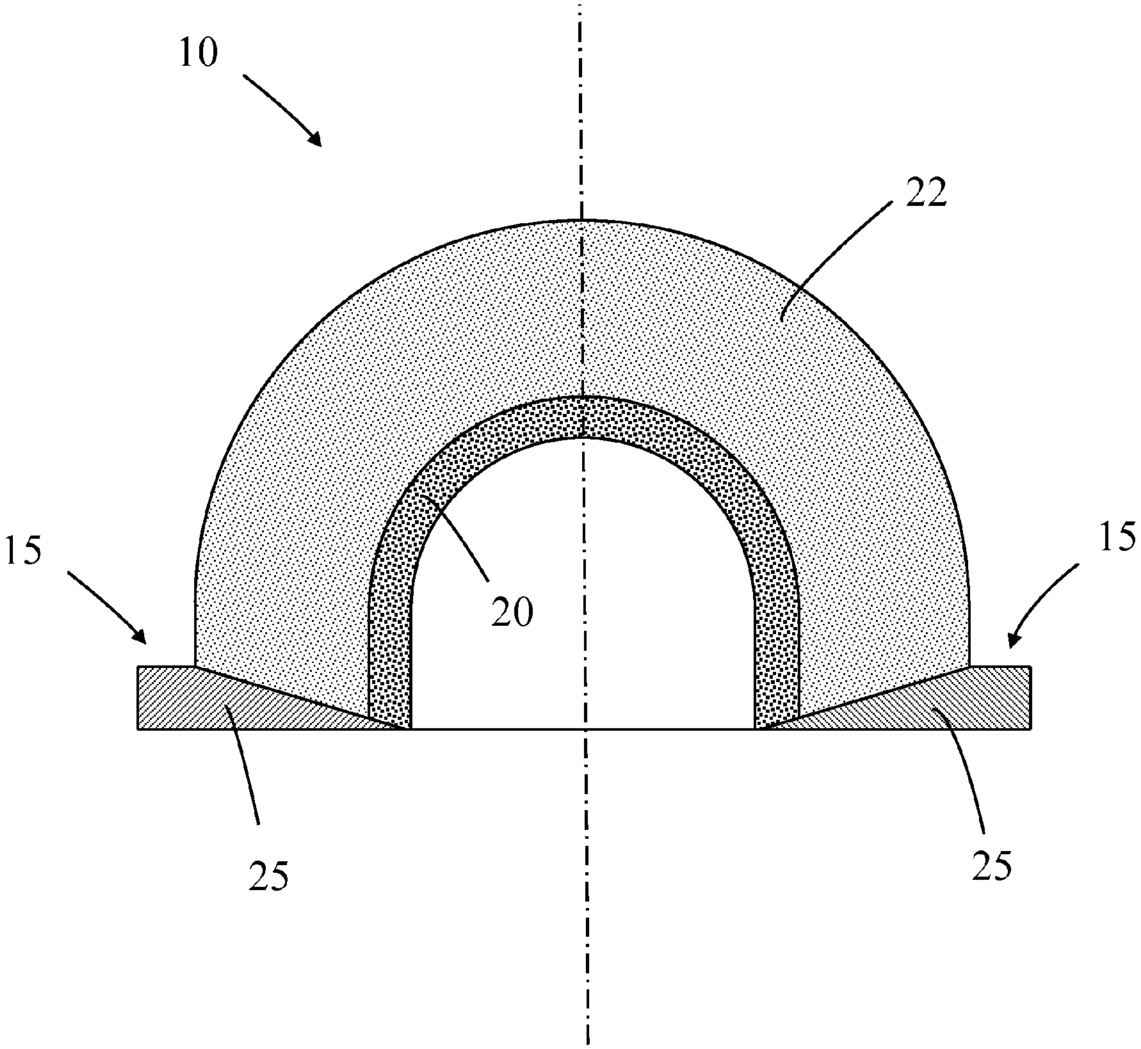
FIG. 4 is a schematic sectional view of an integrated photoluminescence wavelength conversion component in accordance with an embodiment of the invention.

FIGS. 3 and 4 illustrate two example different lamps that can be implemented using the integrated component of the present invention.

FIG. 3 illustrates an integrated component 10 for a linear lamp. This version of the integrated component 10 has a body that is extended in a lengthwise direction, with the same cross-sectional profile shown in FIG. 2 running throughout the length of the body. To assemble a linear lamp, the component 10 of FIG. 3 is mounted onto a base, where an array of LEDs is placed at spaced intervals within/under the interior of the component 10.

FIG. 4 illustrates a cross sectional view of an integrated component having a shape that is generally a dome. In this approach, the feet 15 extend in either a full or partial circular pattern around the base of the component 10. The reflector 25 has an annular profile that forms the base of the component 10.

Figure 5:
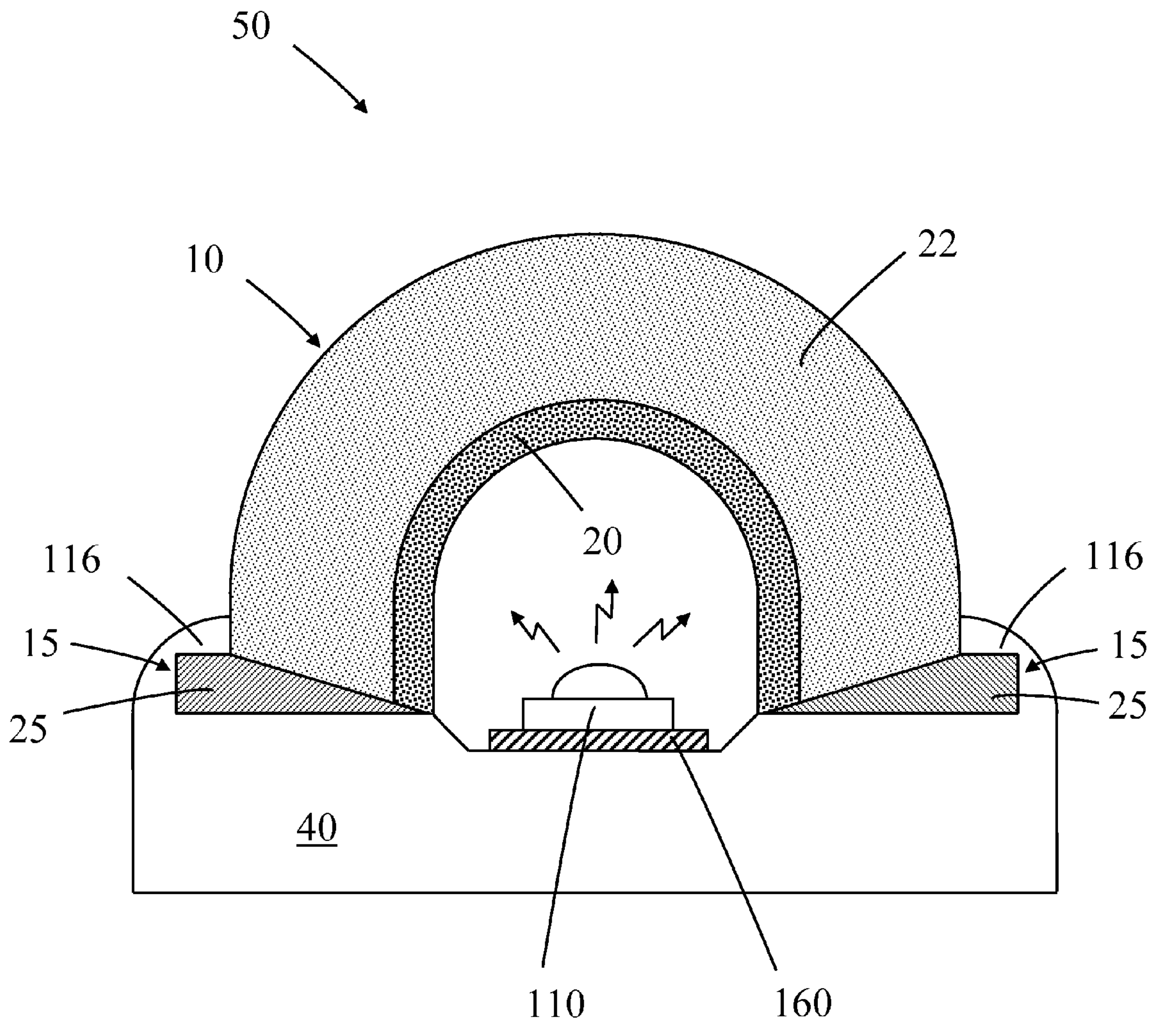
FIG. 5 is a schematic end view of an LED-based linear lamp utilizing the photoluminescence wavelength conversion component of FIGS. 2 and 3.

FIG. 5 illustrates an LED-based linear lamp 50 in accordance with embodiments of the invention, where the integrated component 10 (i.e. the component of FIG. 2) is mounted to a base 40. The base 40 is made of a material with a high thermal conductivity (typically ≥150 $Wm^{-1}K^{-1}$, preferably ≥200 $Wm^{-1}K^{-1}$) such as for example aluminum (≈250 $Wm^{-1}K^{-1}$), an alloy of aluminum, a magnesium alloy, a metal loaded plastics material such as a polymer, for example an epoxy. Conveniently the base 40 can be extruded, die cast (e.g., when it comprises a metal alloy) and/or molded, by for example injection molding (e.g., when it comprises a metal loaded polymer).

One or more solid-state light emitter 110 is/are mounted on a substrate 160. In some embodiments, the substrate 160 comprises a circular MCPCB (Metal Core Printed Circuit Board). As is known a MCPCB comprises a layered structure composed of a metal core base, typically aluminum, a thermally conducting/electrically insulating dielectric layer and a copper circuit layer for electrically connecting electrical components in a desired circuit configuration. The metal core base of the MCPCB 160 is mounted in thermal communication with the upper surface of the base 40, e.g., with the aid of a thermally conducting compound such as for example a material containing a standard heat sink compound containing beryllium oxide or aluminum nitride. A light reflective mask can be provided overlaying the MCPCB that includes apertures corresponding to each LED 110 to maximize light emission from the lamp.

Each solid-state light emitter 110 can comprise a gallium nitride-based blue light emitting LED operable to generate blue light with a dominant wavelength of 455 nm-465 nm. The LEDs 110 can be configured as an array, e.g., in a linear array and/or oriented such that their principle emission axis is parallel with the projection axis of the lamp.

The wavelength conversion layer 20 of lamp 50 includes one or more photoluminescence materials. In some embodiments, the photoluminescence materials comprise phosphors. For the purposes of illustration only, the following description is made with reference to photoluminescence materials embodied specifically as phosphor materials. However, the invention is applicable to any type of photoluminescence material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths.

The one or more phosphor materials can include an inorganic or organic phosphor such as for example silicate-based phosphor of a general composition $A_3Si(O,D)_5$ or $A_2Si(O,D)_4$ in which Si is silicon, O is oxygen, A includes strontium (Sr), barium (Ba), magnesium (Mg) or calcium (Ca) and D includes chlorine (Cl), fluorine (F), nitrogen (N) or sulfur (S). Examples of silicate-based phosphors are disclosed in U.S. Pat. No. 7,575,697 B2 "Silicate-based green phosphors", U.S. Pat. No. 7,601,276 B2 "Two phase silicate-based yellow phosphors", U.S. Pat. No. 7,655,156 B2 "Silicate-based orange phosphors" and U.S. Pat. No. 7,311,858 B2 "Silicate-based yellow-green phosphors". The phosphor can also include an aluminate-based material such as is taught in co-pending patent application US2006/0158090 A1 "Novel aluminate-based green phosphors" and patent U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can include any phosphor material including nitride and/or sulfate phosphor materials, oxy-nitrides and oxy-sulfate phosphors or garnet materials (YAG).

Quantum dots can comprise different materials, for example cadmium selenide (CdSe). The color of light generated by a quantum dot is enabled by the quantum confinement effect associated with the nano-crystal structure of the quantum dots. The energy level of each quantum dot relates directly to the size of the quantum dot. For example, the larger quantum dots, such as red quantum dots, can absorb and emit photons having a relatively lower energy (i.e. a relatively longer wavelength). On the other hand, orange quantum dots, which are smaller in size can absorb and emit photons of a relatively higher energy (shorter wavelength). Additionally, daylight panels are envisioned that use cadmium free quantum dots and rare earth (RE) doped oxide colloidal phosphor nano-particles, in order to avoid the toxicity of the cadmium in the quantum dots.

Examples of suitable quantum dots include: CdZnSeS (cadmium zinc selenium sulfide), $Cd_xZn_{1-x}$ Se (cadmium zinc selenide), $CdSe_xS_{1-x}$ (cadmim selenium sulfide), CdTe (cadmium telluride), $CdTe_xS_{1-x}$ (cadmium tellurium sulfide), InP (indium phosphide), $In_xGa_{1-x}$ P (indium gallium phosphide), InAs (indium arsenide), $CuInS_2$ (copper indium sulfide), $CuInSe_2$ (copper indium selenide), $CuInS_xSe_{2-x}$ (copper indium sulfur selenide), $CuIn_xGa_{1-x}$ $S_2$ (copper indium gallium sulfide), $CuIn_xGa_{1-x}Se_2$ (copper indium gallium selenide), $CuIn_xAl_{1-x}$ $Se_2$ (copper indium aluminum selenide), $CuGaS_2$ (copper gallium sulfide) and $CuInS_{2x}ZnS_{1-x}$ (copper indium selenium zinc selenide).

The quantum dots material can comprise core/shell nano-crystals containing different materials in an onion-like structure. For example, the above described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmiun-based quantum dots, e.g. CdSe quantum dots, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2$/ZnS, $CuInS_2$/CdS, $CuInS_2$/$CuGaS_2$, $CuInS_2$/$CuGaS_2$/ZnS and so on.

The optical component 22 can be configured to include light diffusive (scattering) material. Example of light diffusive materials include particles of Zinc Oxide (ZnO), titanium dioxide ($TiO_2$), barium sulfate ($BaSO_4$), magnesium oxide (MgO), silicon dioxide ($SiO_2$) or aluminum oxide ($Al_2O_3$). A description of scattering particles that can be used in conjunction with the present invention is provided in U.S. Provisional Application No. 61/793,830, filed on Mar. 14, 2013, entitled "DIFFUSER COMPONENT HAVING SCATTERING PARTICLES", which is hereby incorporated by reference in its entirety.

The reflector portion 25 can comprise a light reflective material, e.g., an injection molded part composed of a light reflective plastics material. Alternatively the reflector can comprise a metallic component or a component with a metallization surface.

In operation, the LEDs 110 generate blue excitation light a portion of which excite the photoluminescence material within the wavelength conversion layer 20 which in response generates by a process of photoluminescence light of another wavelength (color) typically yellow, yellow/green, orange, red or a combination thereof. The portion of blue LED generated light combined with the photoluminescence material generated light gives the lamp an emission product that is white in color.

Figure 6:
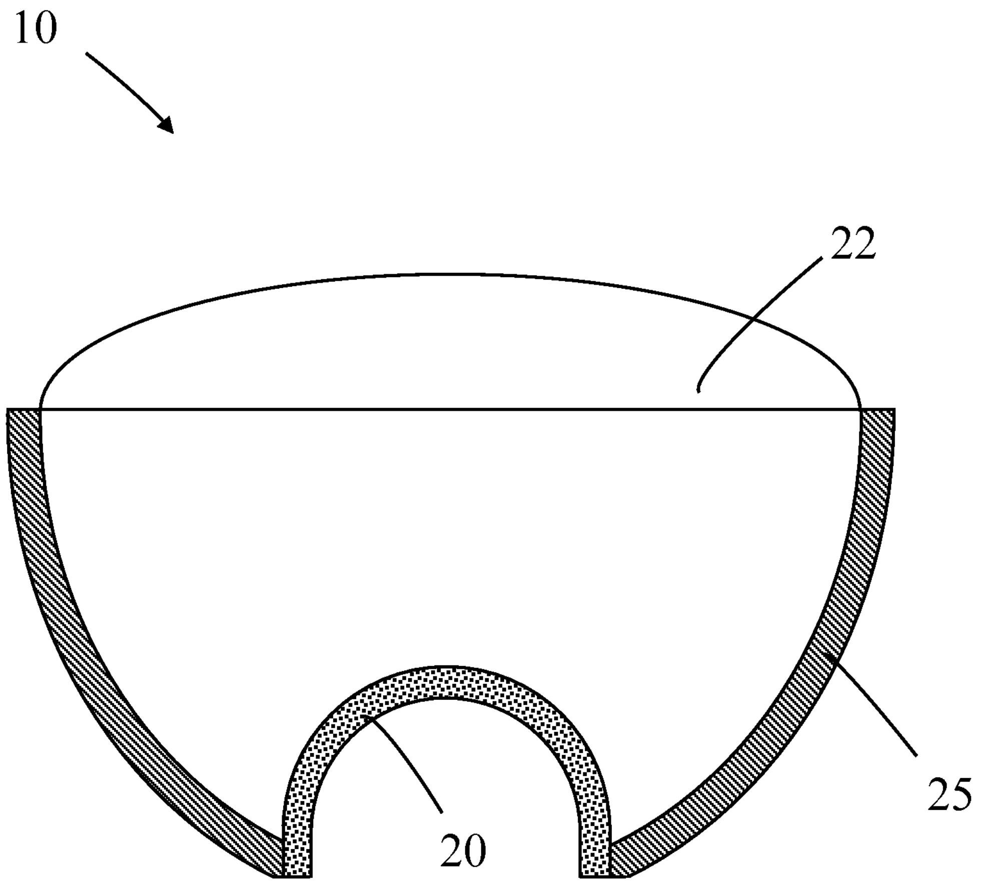
FIG. 6 is a schematic end view of an integrated photoluminescence wavelength conversion component in accordance with an embodiment of the invention.

FIG. 6 is a schematic partial sectional view of an integrated component 10 intended for a reflector lamp, e.g., such as an MR16 lamp. In this embodiment the photoluminescence wavelength conversion portion 20 comprises dome-shape in the center of the component. The reflector portion 25 comprises a light reflective material on its inner surface. The wavelength conversion portion 20 of the component 10 is located at or near the focal point of reflector portion 25. An optical component portion 22 is disposed at the projecting end of the component 10. The optical component portion 22 may be configured as a lens in some embodiments. The optical component portion 22 may be configured to include light diffusive materials.

The interior of the component 10 may include a solid fill material. In some embodiments, the solid fill material has a matching index of refraction to the material of the wavelength conversion portion 20. In some embodiments, the same base material is used to manufacture both the wavelength conversion portion 20 and the solid fill, with the exception that the solid fill does not include photoluminescence materials.

Figure 7:
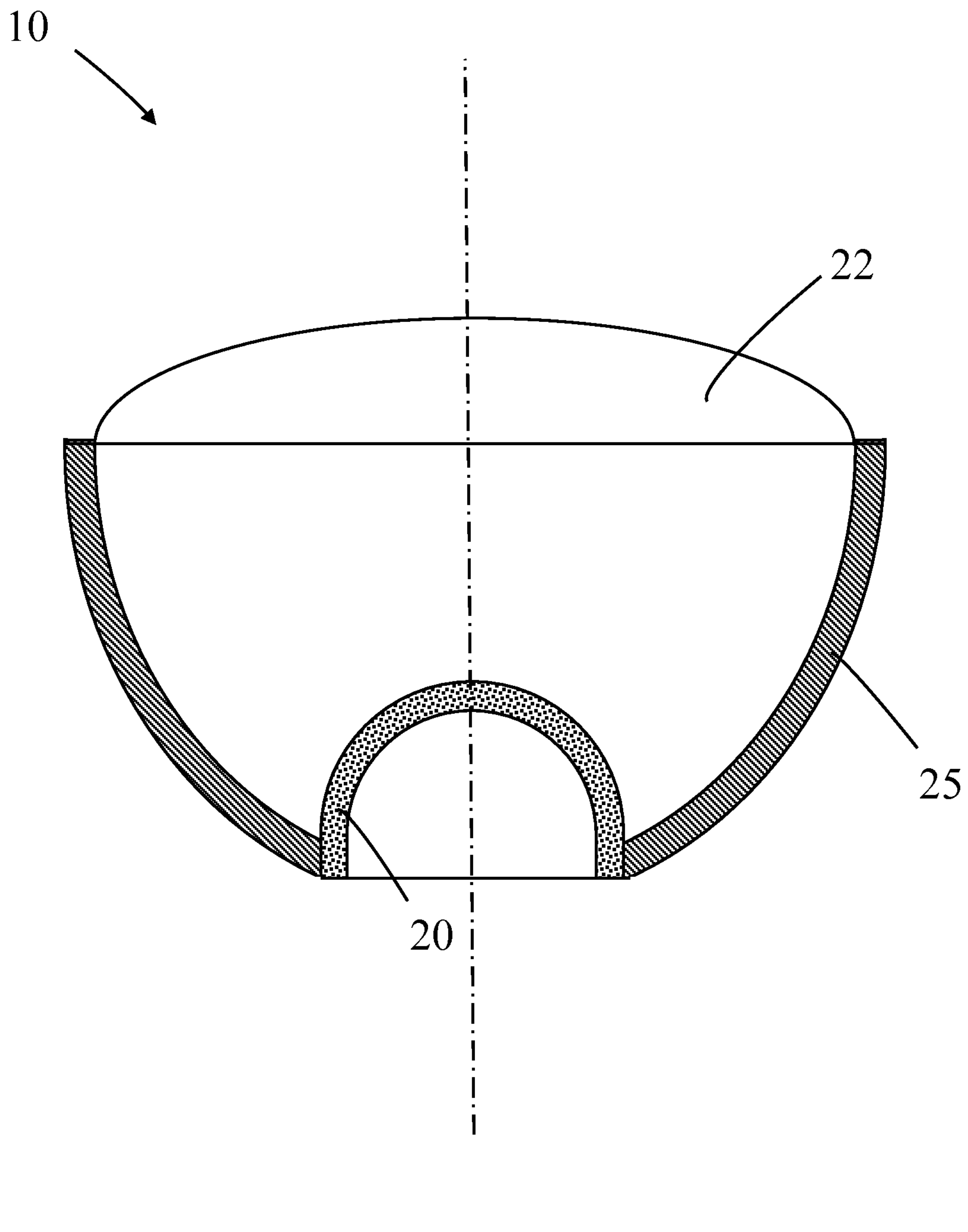
FIG. 7 is a schematic sectional view of an integrated photoluminescence wavelength conversion component in accordance with an embodiment of the invention.
Figure 8:
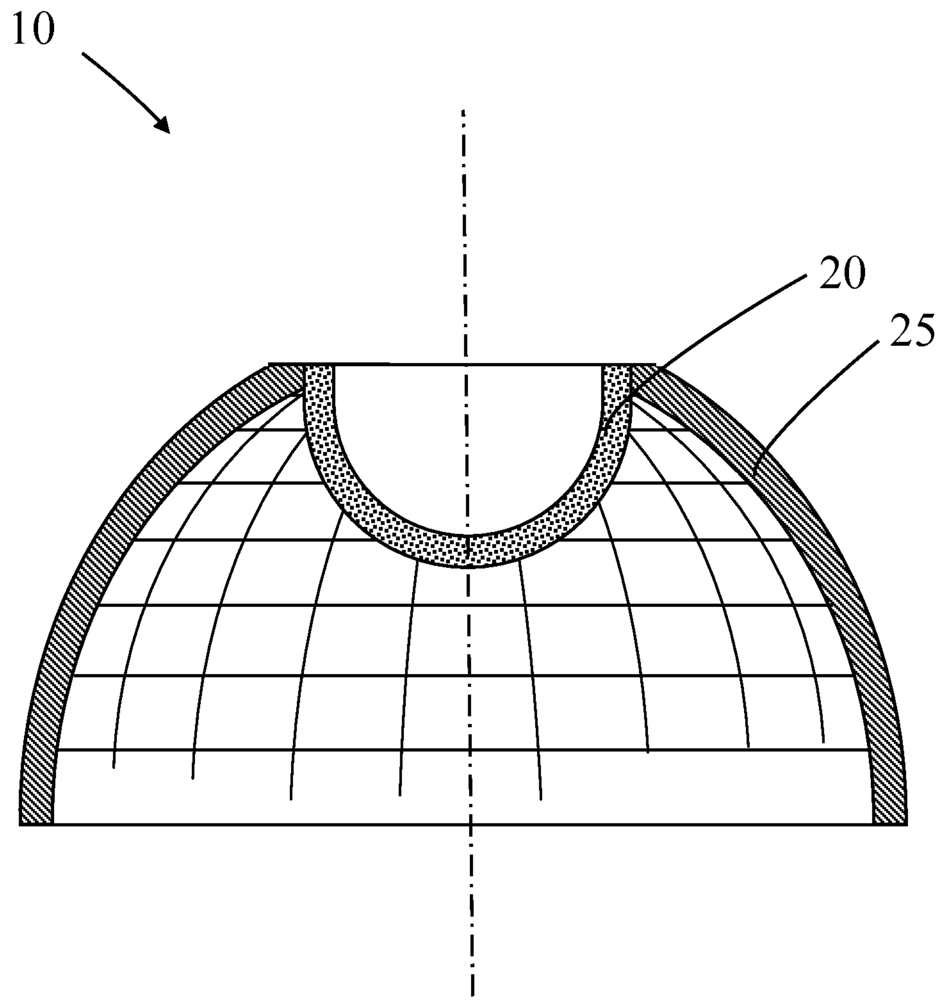
FIG. 8 is a schematic sectional view of an integrated photoluminescence wavelength conversion component in accordance with an embodiment of the invention.
Figure 9:
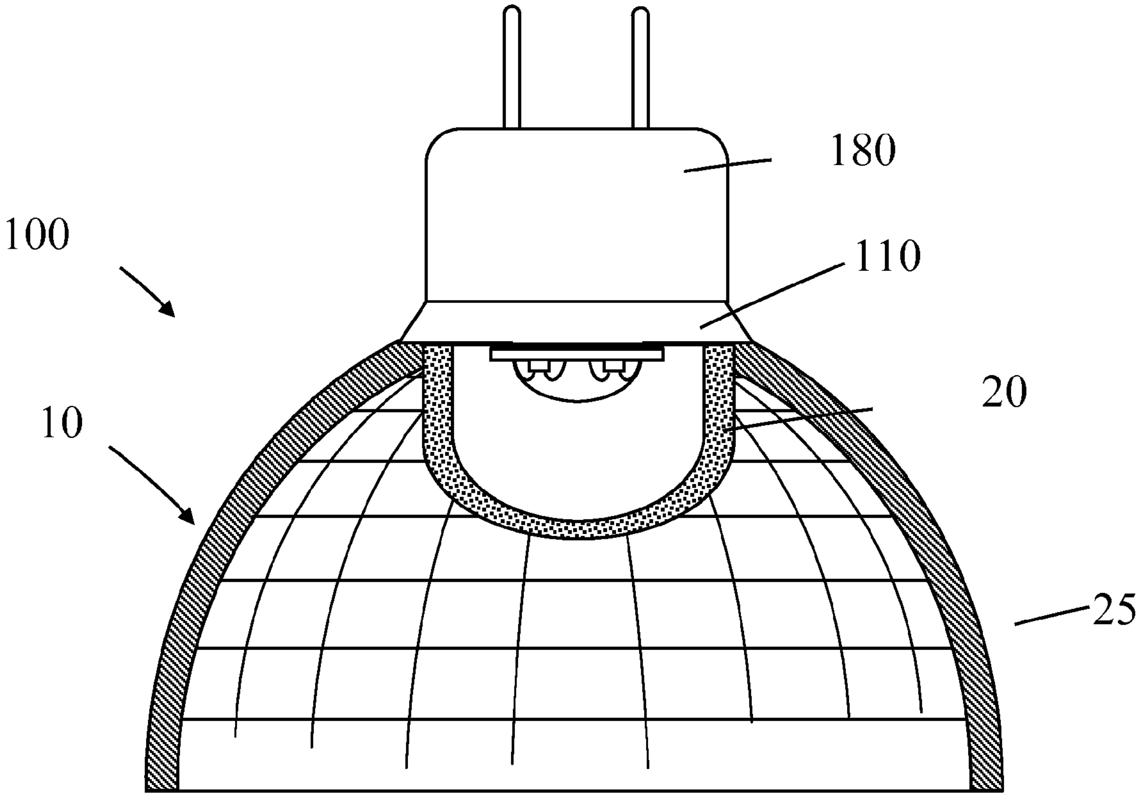
FIG. 9 is a schematic end view of an LED-based reflector lamp utilizing the photoluminescence wavelength conversion component of FIG. 8.

FIG. 7 illustrates that the component 10 can have a generally frusto-conical shape. FIG. 8 illustrates that the reflector portion 25 of the component may include multi-faceted reflector configuration within the interior surface of the component. FIG. 9 shows a reflector lamp product that includes the integrated component, e.g., such as an MR16 lamp product. The lamp product includes one or more LEDs 110 and an electrical connector 180.

In embodiments where the integrated component has a constant cross section, it can be readily manufactured using an extrusion method. Some or all of the integrated component can be formed using a light transmissive thermoplastics (thermosoftening) material such as polycarbonate, acrylic or a low temperature glass using a hot extrusion process. Alternatively some or all of the component can comprise a thermosetting or UV curable material such as a silicone or epoxy material and be formed using a cold extrusion method. A benefit of extrusion is that it is relatively inexpensive method of manufacture. It is noted that the integrated component can be co-extruded in some embodiments even if it includes a non-constant cross-section.

A co-extrusion approach can be employed to manufacture the integrated component. Each of the reflector 25, wavelength conversion 20, and optical 22 portions are co-extruded using respective materials appropriate for that portion of the integrated component. For example, the wavelength conversion portion 20 is extruded using a base material having photoluminescence materials embedded therein. The reflector portion 25 can be co-extruded such that is entirely manufactured with light reflective plastics, and/or where only the interface between the reflector portion 25 and the wavelength conversion portion 20 is co-extruded with the light reflective plastics and the rest of the reflector portion 25 is extruded using other appropriate materials. The optical component portion 22 can be co-extruded using any suitable material, e.g., a light transmissive thermoplastics by itself or thermoplastics that includes light diffusive materials embedded therein.

Alternatively, some or all of the component can be formed by injection molding though such a method tends to be more expensive than extrusion. If the component has a constant cross section, it can be formed using injection molding without the need to use an expensive collapsible former. In other embodiments the component can be formed by casting.

In some embodiments, some or all of the different reflector 25, wavelength conversion 20, and optical 22 portions of the integrated component are manufactured with base materials having matching indices of refraction. This approach tends to reduce light losses at the interfaces between the different portions, increasing the emission efficiencies of the overall lighting product.

It will be appreciated that the invention is not limited to the exemplary embodiments described and that variations can be made within the scope of the invention.

What is claimed is:

1. A photoluminescence wavelength conversion component comprising:

a first portion having at least one photoluminescence material; and a second portion comprising light reflective material, wherein the first portion and the second portion form a unitary component that is integrally manufactured and are not separate components assembled together, wherein the unitary component forms the photoluminescence wavelength conversion component, and wherein the photoluminescence wavelength conversion component having the first portion and the second portion is extended in a lengthwise direction and has a constant cross-sectional profile along the lengthwise direction.

2. The component of claim 1, and further comprising a third optical portion, wherein the third optical portion is integrated with the first and second portions to form the photoluminescence wavelength conversion component.

3. The component of claim 2, wherein the third optical portion comprises a lens.

4. The component of claim 2, wherein the third optical portion comprises a light diffusive material.

5. The component of claim 1, wherein the first portion and the second portion have matching indices of refraction.

6. The component of claim 1, wherein the first portion and the second portion are manufactured from the same base material.

7. The component of claim 1, wherein the first portion and the second portion are co-extruded.

8. The component of claim 1, wherein the at least one photoluminescence material is incorporated in and homogeneously distributed throughout the volume of the first portion.

9. The component of claim 1, wherein the second portion comprises an angled slope extending from the base of the first portion.

10. The component of claim 9, wherein the angled slope extends from the base of the first portion to a top of an attachment portion of the photoluminescence wavelength conversion component.

11. A method of manufacturing a lamp, comprising:

receiving an integrated photoluminescence wavelength conversion component, wherein the integrated photoluminescence wavelength conversion component comprises a first portion having at least one photoluminescence material and a second portion comprising light reflective material, wherein the first portion and the second portion form a unitary component that is integrally manufactured and are not separate components assembled together, wherein the integrated photoluminescence wavelength conversion component having the first portion and the second portion is extended in a lengthwise direction and has a constant cross-sectional profile along the lengthwise direction; and assembling the lamp by attaching the integrated photoluminescence wavelength conversion component to a base, such that the integrated photoluminescence wavelength conversion component is attached to the base without separately attaching the first portion and the second portion to the base.

12. A method of manufacturing a photoluminescence wavelength conversion component, comprising:

co-extruding a first portion having at least one photoluminescence material; and co-extruding a second portion comprising light reflective material, wherein the first portion and the second portion form a unitary component that is integrally manufactured and are not separate components assembled together, wherein the photoluminescence wavelength conversion component having the first portion and the second portion is extended in a lengthwise direction and has a constant cross-sectional profile along the lengthwise direction.

13. The method of claim 12 and further comprising: co-extruding a third optical portion.

14. The method of claim 13, wherein the third optical portion comprises a light diffusive material.

15. The component of claim 1, wherein the component is linear.

16. The component of claim 1, wherein the light reflective material is incorporated in and substantially homogeneously distributed throughout the volume of the second portion.

17. The component of claim 1, wherein the second portion extends from a base of the first portion.

18. The component of claim 1, wherein a light reflective surface of the second region is within the interior of the photoluminescence wavelength conversion component.

19. The component of claim 17, wherein the second region comprises an attachment portion.

20. The component of claim 17, wherein the second portion extends outwardly from a base of the first portion.

* * * * *